United States Patent
Ho et al.

(10) Patent No.: US 12,283,488 B2
(45) Date of Patent: Apr. 22, 2025

(54) INTERCONNECT STRUCTURE FOR INSERTION LOSS REDUCTION IN SIGNAL TRANSMISSION AND METHOD THEREOF

(71) Applicant: YUAN ZE UNIVERSITY, Taoyuan (TW)

(72) Inventors: Cheng En Ho, Taoyuan (TW); Shun Cheng Chang, Taoyuan (TW); Jun Chou Yu, Taoyuan (TW); Cheng Yu Lee, Taoyuan (TW); Chien Chang Huang, Taoyuan (TW)

(73) Assignee: YUAN ZE UNIVERSITY, Taoyuan (TW)

(*) Notice: Subject to any disclaimer, the term of this patent is extended or adjusted under 35 U.S.C. 154(b) by 701 days.

(21) Appl. No.: 17/462,033

(22) Filed: Aug. 31, 2021

(65) Prior Publication Data
US 2022/0319865 A1 Oct. 6, 2022

(30) Foreign Application Priority Data
Mar. 30, 2021 (TW) ................................. 110111538

(51) Int. Cl.
| | |
|---|---|
| *H01L 21/3213* | (2006.01) |
| *H01L 23/528* | (2006.01) |
| *H01L 23/66* | (2006.01) |
| *H05K 1/02* | (2006.01) |
| *H05K 3/06* | (2006.01) |

(52) U.S. Cl.
CPC .... *H01L 21/32134* (2013.01); *H01L 23/5283* (2013.01); *H01L 23/66* (2013.01); *H05K 1/0242* (2013.01); *H05K 3/06* (2013.01); *H01L 2223/6605* (2013.01); *H05K 2201/0364* (2013.01); *H05K 2203/1184* (2013.01)

(58) Field of Classification Search
None
See application file for complete search history.

(56) References Cited

U.S. PATENT DOCUMENTS

| | | | |
|---|---|---|---|
| 6,812,576 B1 * | 11/2004 | Fazelpour | H01L 23/66 257/776 |
| 2017/0358545 A1 * | 12/2017 | Choi | H01L 24/13 |
| 2020/0080215 A1 * | 3/2020 | Zhang | C25D 3/38 |

* cited by examiner

*Primary Examiner* — Xiaoming Liu
(74) *Attorney, Agent, or Firm* — Chih Feng Yeh; YongJean Consulting Inc.

(57) ABSTRACT

An interconnect structure for insertion loss reduction in signal transmission and a method thereof are disclosed. In an embodiment, an interconnect is formed on a substrate by chemical etching process, and when the interconnect is protected by photoresist in chemical etching process, the etching direction of etching solution is not oriented, so undercut areas are respectively formed on both sides of a bottom of the interconnect at contact of the interconnect and the substrate because of etching solution residue after the etching process. An included angle formed in the undercut area between the interconnect and the substrate is defined as an etch angle, and a length of the portion, exposing in the undercut area, of the substrate is defined as an etch length. Controlling sizes of the etch angle and the etch length can reduce an insertion loss in signal transmission.

10 Claims, 11 Drawing Sheets

An interconnect is formed on a substrate by chemical etching process, and undercut areas are respectively formed on both sides of a bottom of the interconnect at contact of the interconnect and the substrate because of the etching solution residue respectively ⟶ 101

An angle in the undercut area between the interconnect and the substrate is defined as an etch angle, and a length of a portion, exposing in the undercut area, of the substrate is defined as an etch length ⟶ 102

A size of the etch angle and a size of the etch length are controlled to reduce an insertion loss of the interconnect in signal transmission ⟶ 103

FIG. 6

INTERCONNECT STRUCTURE FOR INSERTION LOSS REDUCTION IN SIGNAL TRANSMISSION AND METHOD THEREOF

CROSS-REFERENCE TO RELATED APPLICATIONS

The present application is based on, and claims priority from, TAIWAN patent application Serial Numbered 110111538 filed on Mar. 30, 2021, the disclosure of which is hereby incorporated in its entirety.

BACKGROUND

1. Technical Field

The present invention is related to an interconnect structure and a method thereof, and more particularly to an interconnect structure in which the size of an etch angle and the size of an etch length are controlled to reduce the insertion loss of the interconnect in signal transmission, and a method of forming the above-mentioned interconnect structure.

2. Related Arts

Forming interconnect on a substrate through chemical etching process is a well-known technology, but it is found that the interconnect formed on the substrate by the chemical etching process has varied insertion loss in signal transmission in actual inspection process, and the increasing of the insertion loss of the interconnect in signal transmission may cause signal attenuation.

Changing the structure of interconnect results in the change of insertion loss in signal transmission and thus affects the performance of signal transmission. Therefore, the present invention discusses the factors that the change of the interconnect structure by etching solution residue may cause the change of the insertion loss in signal transmission. The undercut areas may be formed on the interconnect because of etching solution residue in chemical etching process, so the present invention will study and discuss change of the insertion loss due to an etch angle and an etch length formed in the undercut area of the interconnect.

According to the above-mentioned contents, in order to meet the needs of high-frequency/high-speed signal transmission in communication components in the future, the high insertion loss of the interconnect in signal transmission in the prior art becomes an obstacle to high-frequency/high-speed signal transmission and must be overcome. The high-frequency/high-speed signal optimization technology has not been disclosed in the past, so it is necessary to propose an improved technical solution to solve the above-mentioned problem.

SUMMARY

In order to solve the conventional technology problem that high insertion loss of the interconnect occurs in signal transmission, the present invention discloses an interconnect structure for insertion loss reduction in signal transmission and a method of forming the interconnect structure.

According to an embodiment, the present invention provides an interconnect structure for insertion loss reduction in signal transmission, and the interconnect structure includes a substrate and an interconnect. The interconnect is formed on the substrate by chemical etching process, and undercut areas are respectively formed on both sides of a bottom of the interconnect at contact of the interconnect and the substrate because of etching solution residue respectively. Each of the undercut areas includes an etch angle and an etch length. The etch angle is formed in the undercut area between the interconnect and the substrate, and the etch length is a length of a portion, exposing in the undercut area, of the substrate. The size of the etch angle is controlled and the size of the etch length is controlled to decrease the insertion loss of the interconnect in signal transmission.

According to an embodiment, the present invention provides a method of forming interconnect structure for insertion loss reduction in signal transmission, and the method includes steps of: forming an interconnect on a substrate by chemical etching process, wherein undercut areas are respectively formed on both sides of a bottom of the interconnect at contact of the interconnect and the substrate because of the etching solution residue respectively; defining an angle in the undercut area between the interconnect and the substrate as an etch angle, and defining a length of a portion, exposing in the undercut area, of the substrate as an etch length; controlling a size of the etch angle and a size of the etch length to reduce an insertion loss of the interconnect in signal transmission.

According to the above-mentioned structure and method of the present invention, the difference between the conventional technology and the present invention is that the interconnect is formed on the substrate by chemical etching process, and when the interconnect is protected by photoresist in the chemical etching process, the etching direction of etching solution is not oriented, so concave portions, which are defined as undercut areas, are formed on both sides of the bottom of the interconnect at contact of the interconnect and the substrate because of etching solution residue after the etching process, respectively; the included angle formed in the undercut area between the interconnect and the substrate is defined as the etch angle, and the length of the portion, exposing in the undercut area, of the substrate is defined as the etch length, and the size of the etch angle and the size of the etch length can be controlled to reduce the insertion loss of the interconnect in signal transmission, that is, controlling etching status can control the contact length between the interconnect and the substrate, and decreasing the contact length between the interconnect and the substrate can reduce the insertion loss of the interconnect structure in signal transmission, so as to greatly improve the high-frequency/high-speed signal transmission effect.

By the above-mentioned technical solution, the present invention can achieve the technical effect of controlling the etch angle and the etch length to reduce the insertion loss of the interconnect.

BRIEF DESCRIPTION OF THE DRAWINGS

The structure, operating principle and effects of the present invention will be described in detail by way of various embodiments which are illustrated in the accompanying drawings.

DETAILED DESCRIPTION

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

Forming an interconnect on a substrate by chemical etching process is a well-known technology. In the process of forming the interconnect on the substrate by the chemical etching process, the interconnect is protected by photoresist in chemical etching process and the etching direction of the etching solution is not oriented, concave portions, which are defined as undercut areas, are formed on both sides of a bottom of the interconnect at contact of the interconnect and the substrate because of etching solution residue after the etching process, respectively. The phenomenon of forming the concave portions on the both sides of the bottom of the interconnect is defined as undercut, the angle formed in the undercut area between the interconnect and the substrate is defined as an etch angle, and a length of the portion, exposing in the undercut area, of the substrate is defined as an etch length. It should be noted that the material of the interconnect comprises gold (Au), silver (Ag), copper (Cu), iron (Fe), cobalt (Co), nickel (Ni), palladium (Pd), platinum (Pt), titanium (Ti), tantalum (Ta), tin (Sn) and lead (Pb), or a combination thereof; a root mean square deviation of surface roughness of the interconnect can be in a range of 0 μm to 5 μm; a dielectric constant of the substrate can be in a range of 1 to 50; a signal transmission frequency of the interconnect can be in a range of 1 GHz to 300 GHz; the etch angle can be in a range of 5 degrees to 90 degrees; the substrate can include at least one of a glass substrate, a quartz substrate, a semiconductor substrate, a plastic substrate, a printed circuit board, and a high-speed low-loss substrate. However, these examples are merely for exemplary illustration and the application field of the present invention is not limited to these examples.

First of all, it should be understood that the following embodiments and simulation experiments mentioned in the present invention express the relationship between the etch angle and the etch length based on the premise of a fixed etch height.

A first simulation experiment of the interconnect structure for insertion loss reduction in signal transmission disclosed in the present invention will be described in the following paragraphs. Please refer to FIG. 1A, which is a plane structure diagram of an interconnect structure for insertion loss reduction in signal transmission, according to the first simulation experiment of the present invention.

Figure 1A:
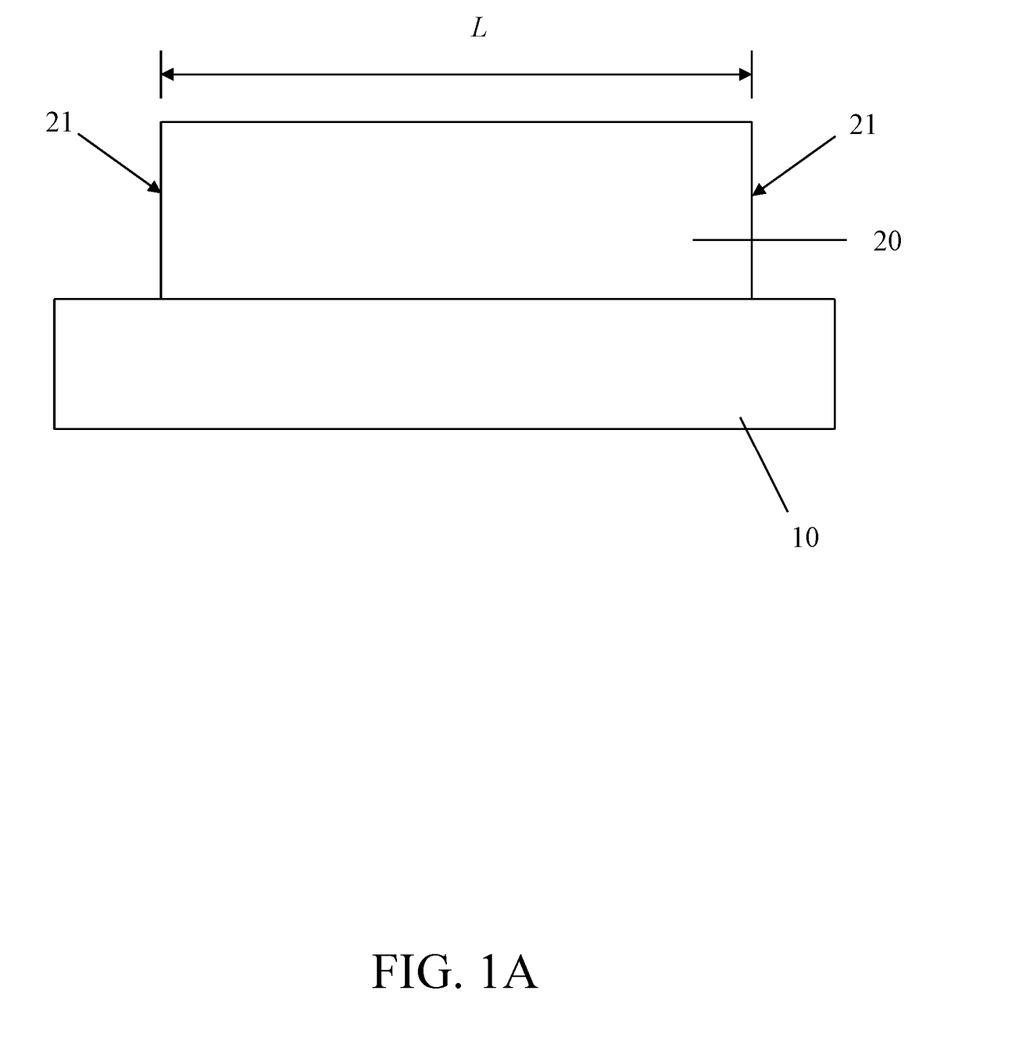
FIG. 1A is a plane structure diagram of an interconnect structure for insertion loss reduction in signal transmission, according to a first simulation experiment of the present invention.

In the first simulation experiment, the interconnect structure includes a substrate 10 and an interconnect 20. The interconnect 20 is formed on the substrate 10 by chemical etching process; in the first simulation experiment, no etching solution residue causes the undercut area at the left and right sides 21 of the bottom of the interconnect 20 at the contact of the interconnect 20 and the substrate 10.

Figure 1B:
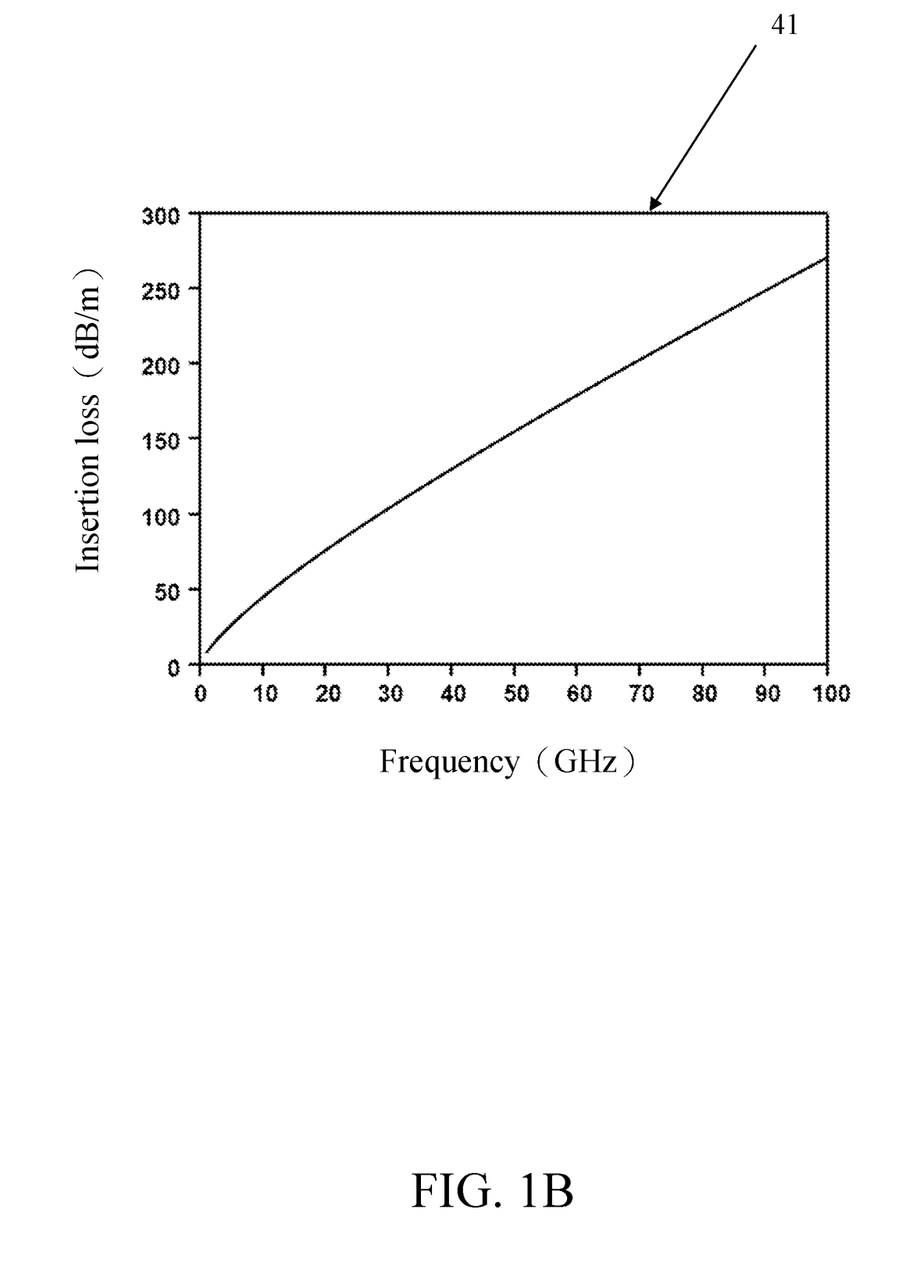
FIG. 1B is a first simulation experiment data diagram of the interconnect structure for insertion loss reduction in signal transmission, according to the first simulation experiment of the present invention.

Please refer to FIG. 1B, which is a first simulation experiment data diagram of an interconnect structure for insertion loss reduction in signal transmission, according to the first simulation experiment of the present invention.

In the first simulation experiment, the simulation of the first simulation experiment is performed by using ANSYS-HFSS 3D high frequency electromagnetic simulation analysis software, the related data used in the first simulation experiment includes that: the material of the interconnect 20 is copper foil, the dielectric constant of the substrate 10 is 3.57, the interconnect has the root mean square deviation of surface roughness in a range of 0 µm to 5 µm, the original length L of the contact of the interconnect 20 and the substrate 10 is fixed as 153 µm, the simulation for the signal transmission of the interconnect 20 formed on the substrate 10 is performed with the signal transmission frequency in a range of 1 GHz to 100 GHz.

The first simulation experiment data 41 is shown in FIG. 1B, which shows an insertion loss versus frequency diagram of the interconnect of the first simulation experiment. When the signal transmission frequency is 6 GHz, the insertion loss of the interconnect 20 in signal transmission is 29.64 dB/m; when the signal transmission frequency is 25 GHz, the insertion loss of the interconnect 20 in signal transmission is 89.76 dB/m; when the signal transmission frequency is 50 GHz, the insertion loss of the interconnect 20 in signal transmission is 154.37 dB/m; when the signal transmission frequency is 75 GHz, the insertion loss of the interconnect 20 in signal transmission is 213.83 dB/m; when the signal transmission frequency is 100 GHz, the insertion loss of the interconnect 20 in signal transmission is 270.58 dB/m, A second simulation experiment of an interconnect structure for insertion loss reduction in signal transmission disclosed in the present invention will be described in the following paragraphs. Please refer to FIG. 2A, which is a plane structure diagram of an interconnect structure for insertion loss reduction in signal transmission, according to the second simulation experiment of the present invention.

Figure 2A:
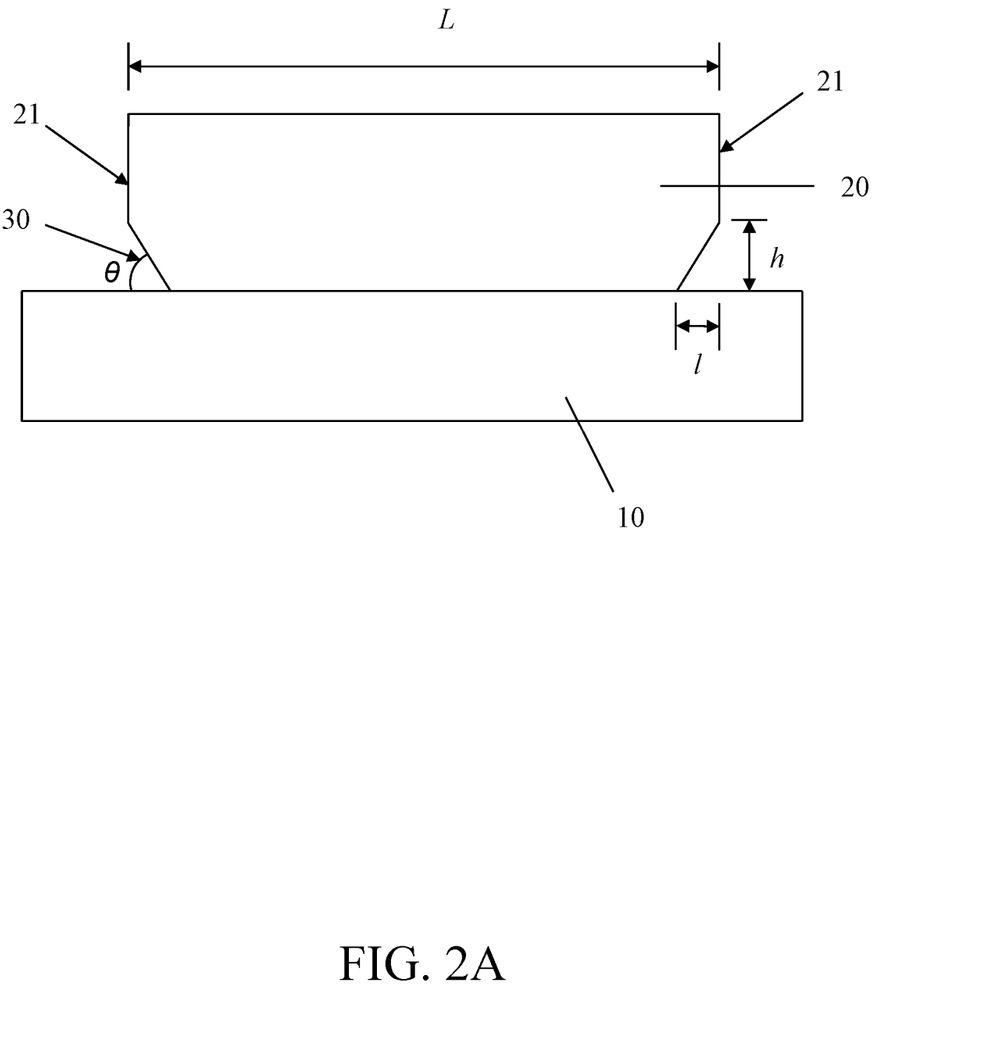
FIG. 2A is a plane structure diagram of an interconnect structure for insertion loss reduction in signal transmission, according to a second simulation experiment of the present invention.

In the second simulation experiment, the interconnect structure includes a substrate 10, an interconnect 20, an etch angle θ and an etch length l. The interconnect 20 is formed on the substrate 10 by the chemical etching process; in the second simulation experiment, undercut areas 30 are formed on left and right sides 21 of the bottom of the interconnect 20 at the contact of the interconnect 20 and the substrate 10 because of etching solution residue, and an etch angle θ is formed in the undercut area 30 between the interconnect 20 and the substrate 10.

Figure 2B:
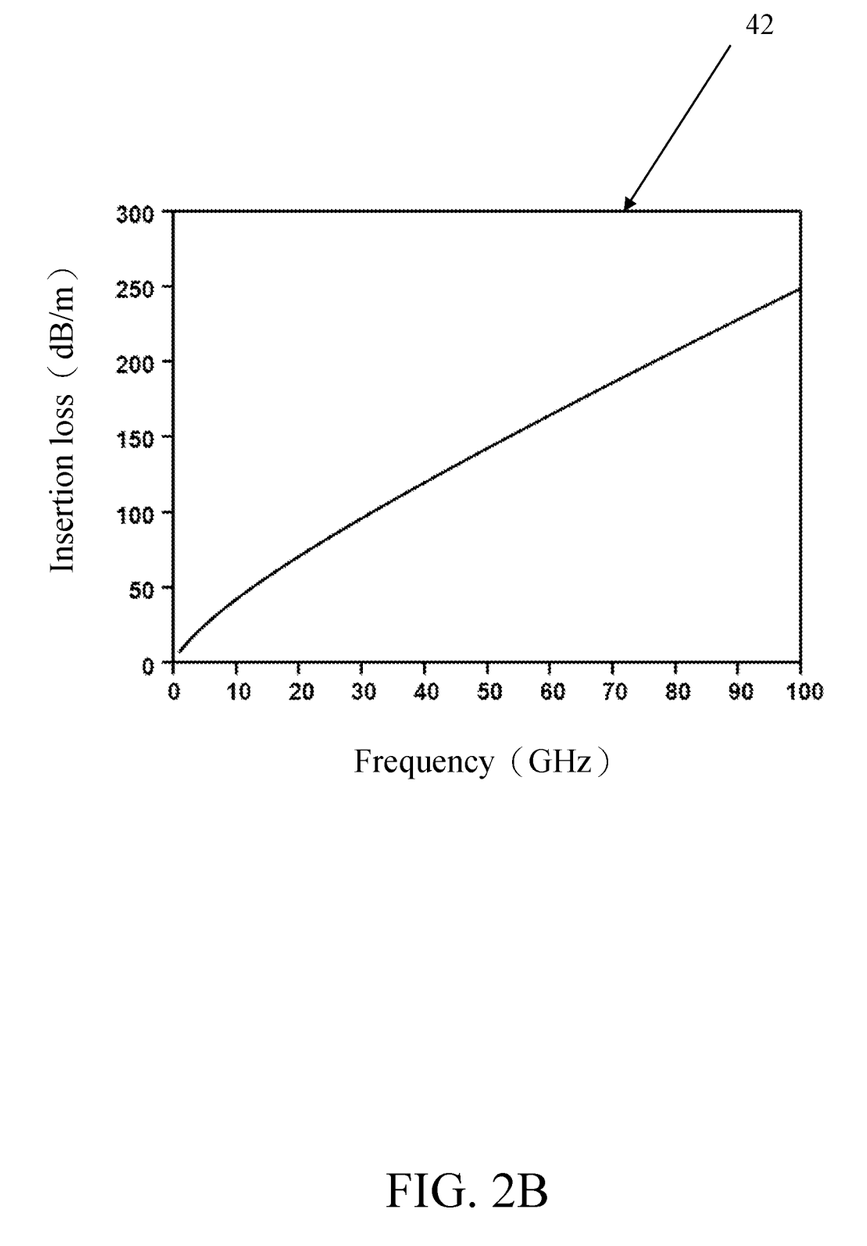
FIG. 2B is a second simulation experiment data diagram of the interconnect structure for insertion loss reduction in signal transmission, according to the second simulation experiment of the present invention.

Please refer to FIG. 2B, which is a second simulation experiment data diagram of an interconnect structure for insertion loss reduction in signal transmission of the present invention.

In the second simulation experiment, the simulation of the second simulation experiment is performed by using ANSYS-HFSS 3D high frequency electromagnetic simulation analysis software, the related data used in the second simulation experiment includes that: the material of the interconnect 20 is copper foil, the dielectric constant of the substrate 10 is 3.57, the interconnect has the root mean square deviation of surface roughness in a range of 0 µm to 5 µm, the etch angle θ is 60 degrees, the original length L of the contact of the interconnect 20 and the substrate 10 is fixed as 153 µm, the etch height h is fixed as 4 µm, the etch length l is 2.3 µm, and the simulation for the signal transmission of the interconnect 20 formed on the substrate 10 is performed with the signal transmission frequency in a range of 1 GHz to 100 GHz. It should be noted that the etch height h and the etch length l are exaggerated for clarity in FIG. 2A.

The second simulation experiment data 42 is measured in a condition that the etch height h is fixed as 4 µm, and the etch angle θ is controlled to be 60 degrees and the etch length l is controlled to be 2.3 µm. The second simulation experiment data 42 is shown in FIG. 2B, which is an insertion loss versus frequency diagram of the interconnect of the second simulation experiment. When the signal transmission frequency is 6 GHz, the insertion loss of the interconnect 20 in signal transmission is 28.48 dB/m; when the signal transmission frequency is 25 GHz, the insertion loss of the interconnect 20 in signal transmission is 83.56 dB/m; when the signal transmission frequency is 50 GHz, the insertion loss of the interconnect 20 in signal transmission is 142.28 dB/m; when the signal transmission frequency is 75 GHz, the insertion loss of the interconnect 20 in signal transmission is 196.47 dB/m; when the signal transmission frequency is 100 GHz, the insertion loss of the interconnect 20 in signal transmission is 248.44 dB/m.

The third simulation experiment of the interconnect structure for insertion loss reduction in signal transmission disclosed in the present invention will be described in the following paragraphs. Please refer to FIG. 3A, which is a plane structure diagram of an interconnect structure for insertion loss reduction in signal transmission, according to a third simulation experiment of the present invention.

Figure 3A:
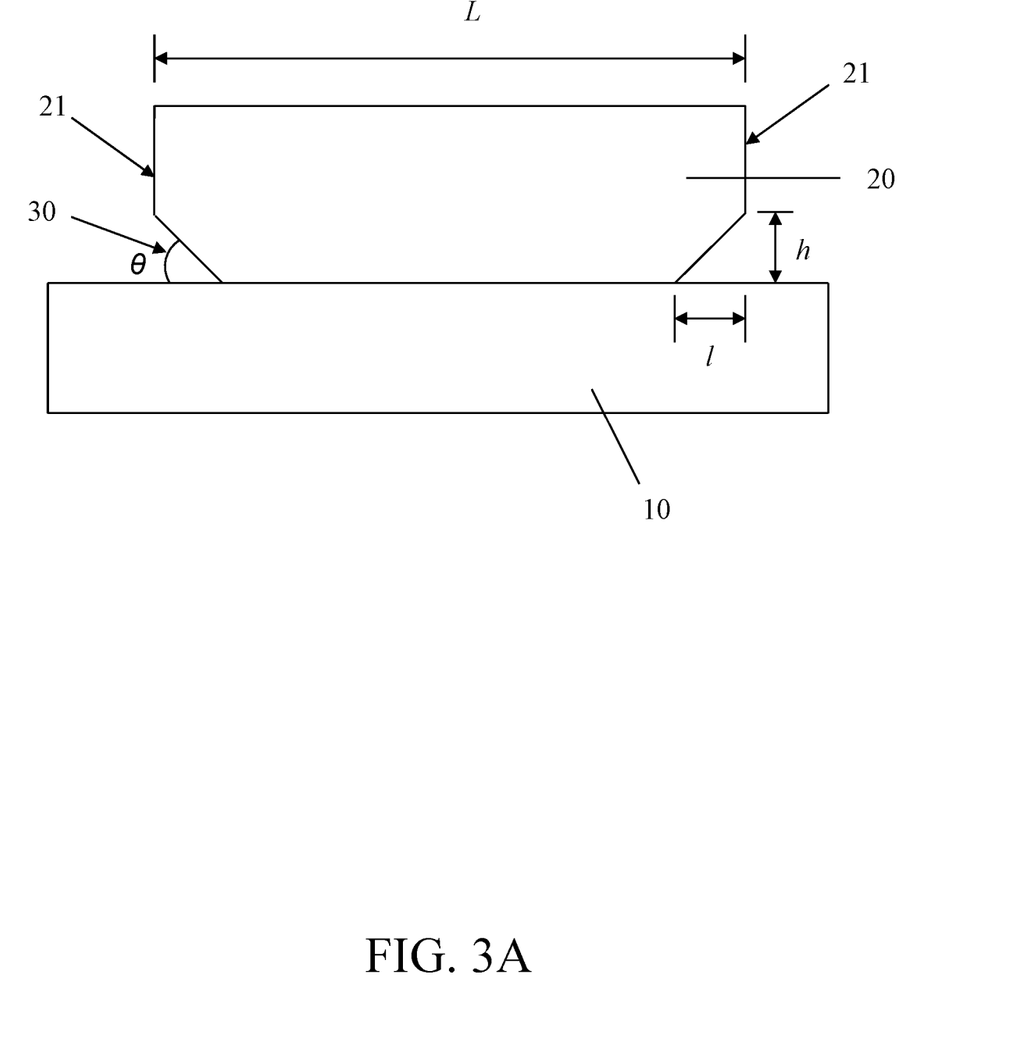
FIG. 3A is a plane structure diagram of an interconnect structure for insertion loss reduction in signal transmission, according to a third simulation experiment of the present invention.

In the third simulation experiment, the interconnect structure includes a substrate 10, an interconnect 20, an etch angle θ and an etch length l. The interconnect 20 is formed on the substrate 10 by the chemical etching process; in the third simulation experiment, undercut areas 30 are formed on left and right sides 21 of a bottom of the interconnect 20 at the contact of the interconnect 20 and the substrate 10 because of etching solution residue, respectively, and an etch angle θ is formed in the undercut area 30 between the interconnect 20 and the substrate 10.

Figure 3B:
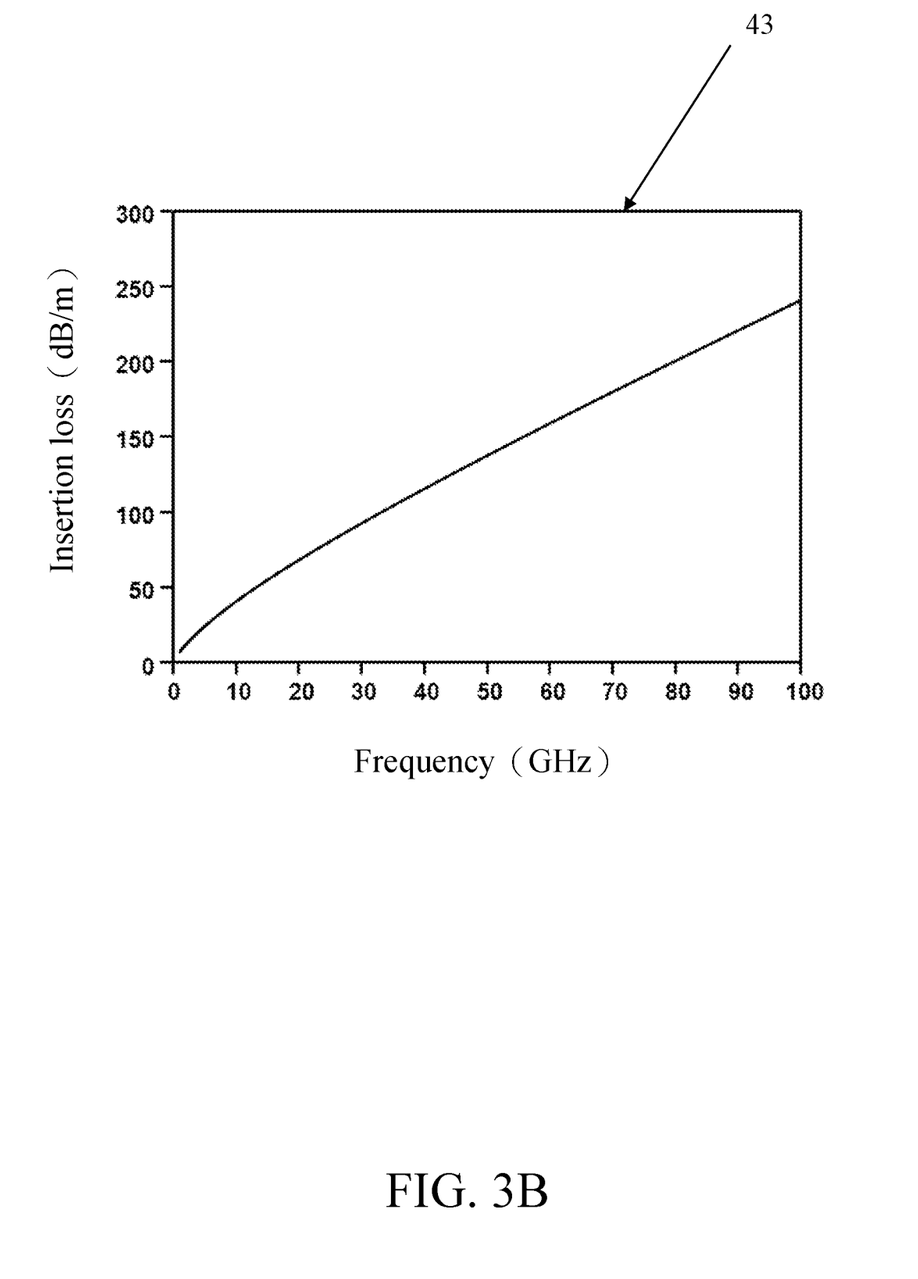
FIG. 3B is a third simulation experiment data diagram of the interconnect structure for insertion loss reduction in signal transmission, according to the third simulation experiment of the present invention.

Please refer to FIG. 3B, which is a third simulation experiment data diagram of an interconnect structure for insertion loss reduction in signal transmission of the present invention.

In the third simulation experiment, the simulation of the third simulation experiment is performed by using ANSYS-HFSS 3D high frequency electromagnetic simulation analysis software, the related data used in the third simulation experiment includes that: the material of the interconnect 20 is copper foil, the dielectric constant of the substrate 10 is 3.57, the interconnect has the root mean square deviation of surface roughness in a range of 0 µm to 5 µm, the etch angle θ is 45 degrees, the original length L of the contact of the interconnect 20 and the substrate 10 is fixed as 153 µm, the etch height h is fixed as 4 µm, the etch length l is 4 µm, and the simulation for the signal transmission of the interconnect 20 formed on the substrate 10 is performed with the signal transmission frequency in a range of 1 GHz to 100 GHz. It should be noted that the etch height h and the etch length l are exaggerated for clarity in FIG. 3A.

The third simulation experiment data 43 is measured in a condition that the etch height h is fixed as 4 µm, and the etch angle θ is controlled to be 45 degrees and the etch length l is controlled to be 4 µm. The third simulation experiment data 43 is shown in FIG. 3B, which is an insertion loss versus frequency diagram of the interconnect of the third simulation experiment. When the signal transmission frequency is 6 GHz, the insertion loss of the interconnect 20 in signal transmission is 27.56 dB/m; when the signal transmission frequency is 25 GHz, the insertion loss of the interconnect 20 in signal transmission is 80.71 dB/m; when the signal transmission frequency is 50 GHz, the insertion loss of the interconnect 20 in signal transmission is 137.59 dB/m; when the signal transmission frequency is 75 GHz, the insertion loss of the interconnect 20 in signal transmission is 190.23 dB/m; when the signal transmission frequency is 100 GHz, the insertion loss of the interconnect 20 in signal transmission is 240.80 dB/m.

The fourth simulation experiment of the interconnect structure for insertion loss reduction in signal transmission disclosed in the present invention will be described in the following paragraphs. Please refer to FIG. 4A, which is a plane structure diagram of an interconnect structure for insertion loss reduction in signal transmission, according to a fourth simulation experiment of the present invention.

Figure 4A:
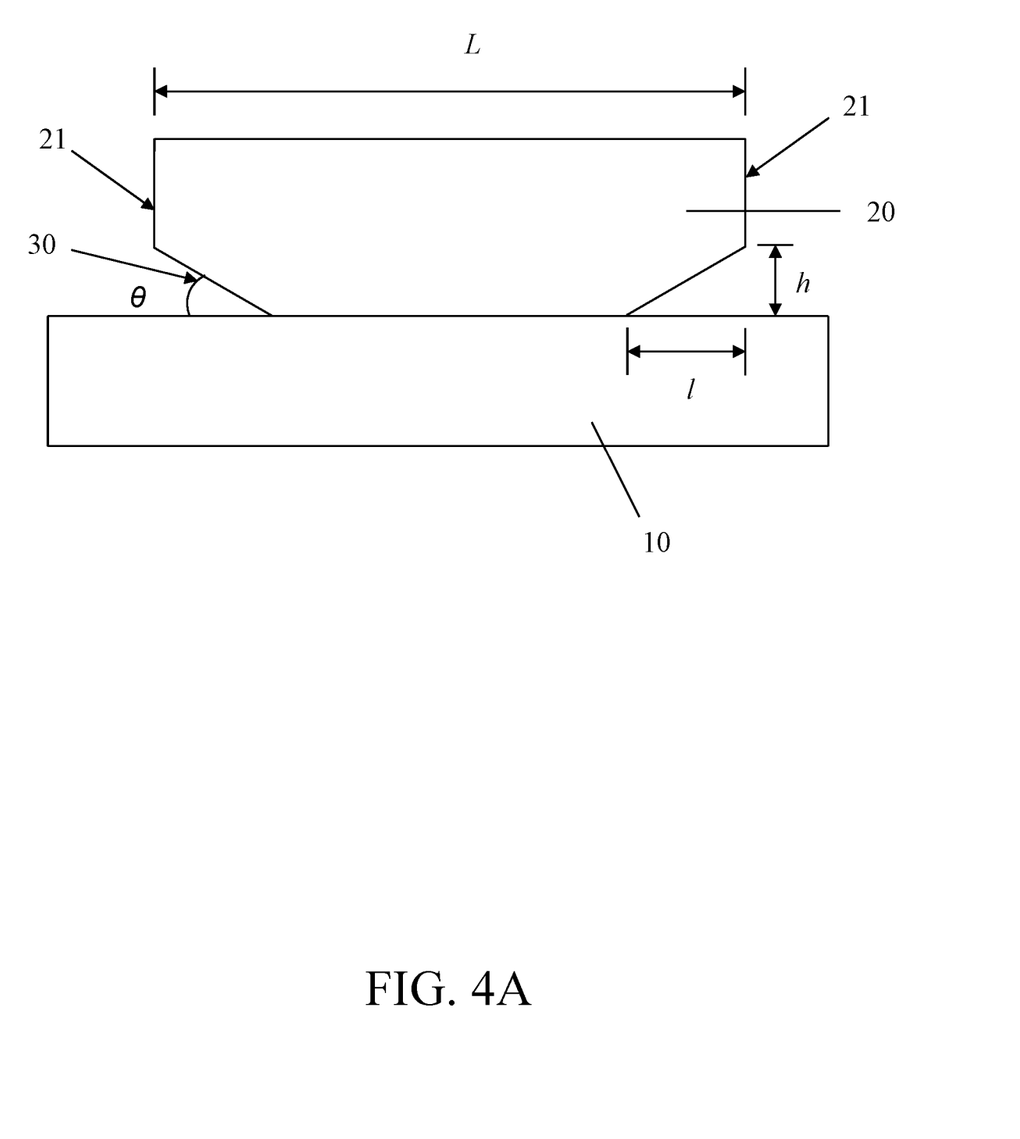
FIG. 4A is a plane structure diagram of an interconnect structure for insertion loss reduction in signal transmission, according to a fourth simulation experiment of the present invention.

In the fourth simulation experiment, the interconnect structure includes a substrate 10, an interconnect 20, an etch angle θ and an etch length l. The interconnect 20 is formed on the substrate 10 by the chemical etching process; in the fourth simulation experiment, undercut areas 30 are formed on left and right sides 21 of the bottom of the interconnect 20 at the contact of the interconnect 20 and the substrate 10 because of etching solution residue, and an etch angle θ is formed in the undercut area 30 between the interconnect 20 and the substrate 10.

Figure 4B:
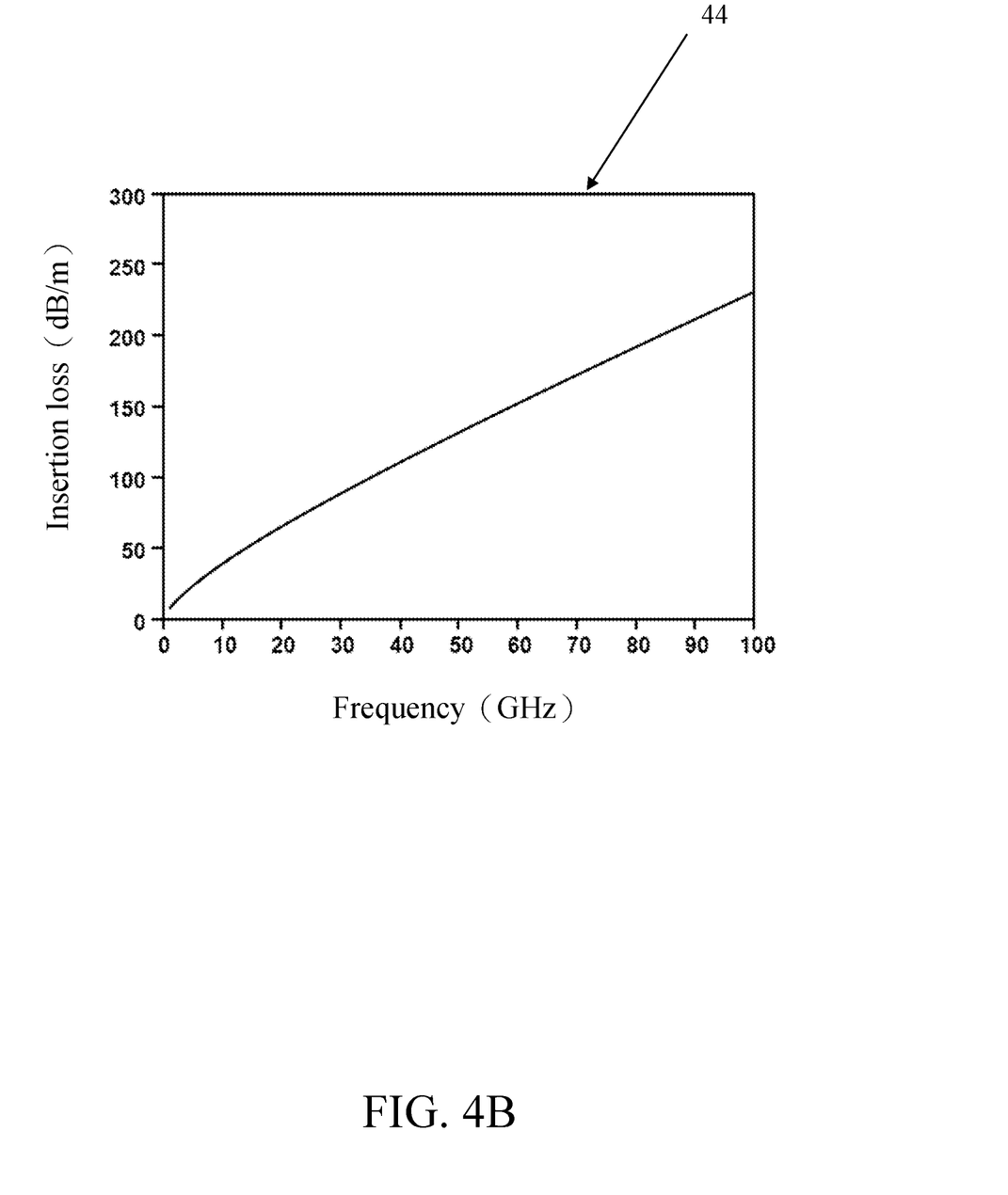
FIG. 4B is a fourth simulation experiment data diagram of the interconnect structure for insertion loss reduction in signal transmission, according to the fourth simulation experiment of the present invention.

Please refer to FIG. 4B, which is a fourth simulation experiment data diagram of an interconnect structure for insertion loss reduction in signal transmission, according to the present invention.

In the fourth simulation experiment, the simulation of the fourth simulation experiment is performed by using ANSYS-HFSS 3D high frequency electromagnetic simulation analysis software, and the related data used in the fourth simulation experiment includes that: the material of the interconnect 20 is copper foil, the dielectric constant of the substrate 10 is 3.57, the interconnect has the root mean square deviation of surface roughness in a range of 0 μm to 5 μm, the etch angle θ is 30 degrees, the original length L of the contact of the interconnect 20 and the substrate 10 is fixed as 153 μm, the etch height h is fixed as 4 μm, the etch length l is 6.9 μm, and the simulation for the signal transmission of the interconnect 20 formed on the substrate 10 is performed with the signal transmission frequency in a range of 1 GHz to 100 GHz. It should be noted that the etch height h and the etch length l are exaggerated, for clarity in FIG. 4A.

The fourth simulation experiment data 44 is measured in a condition that the etch height h is fixed as 4 μm, and the etch angle θ is controlled to be 30 degrees and the etch length l is controlled to be 6.9 μm. The fourth simulation experiment data 44 is shown in FIG. 4B, which is an insertion loss versus frequency diagram of the interconnect of the fourth simulation experiment. When the signal transmission frequency is 6 GHz, the insertion loss of the interconnect 20 in signal transmission is 26.19 dB/m; when the signal transmission frequency is 25 GHz, the insertion loss of the interconnect 20 in signal transmission is 76.75 dB/m; when the signal transmission frequency is 50 GHz, the insertion loss of the interconnect 20 in signal transmission is 131.19 dB/m; when the signal transmission frequency is 75 GHz, the insertion loss of the interconnect 20 in signal transmission is 181.74 dB/m; when the signal transmission frequency is 100 GHz, the insertion loss of the interconnect 20 in signal transmission is 230.42 dB/m.

The fifth simulation experiment of interconnect structure for insertion loss reduction in signal transmission disclosed in the present invention will be described in the following paragraphs. Please refer to FIG. 5A, which is a plane structure diagram of an interconnect structure for insertion loss reduction in signal transmission, according to a fifth simulation experiment of the present invention.

Figure 5A:
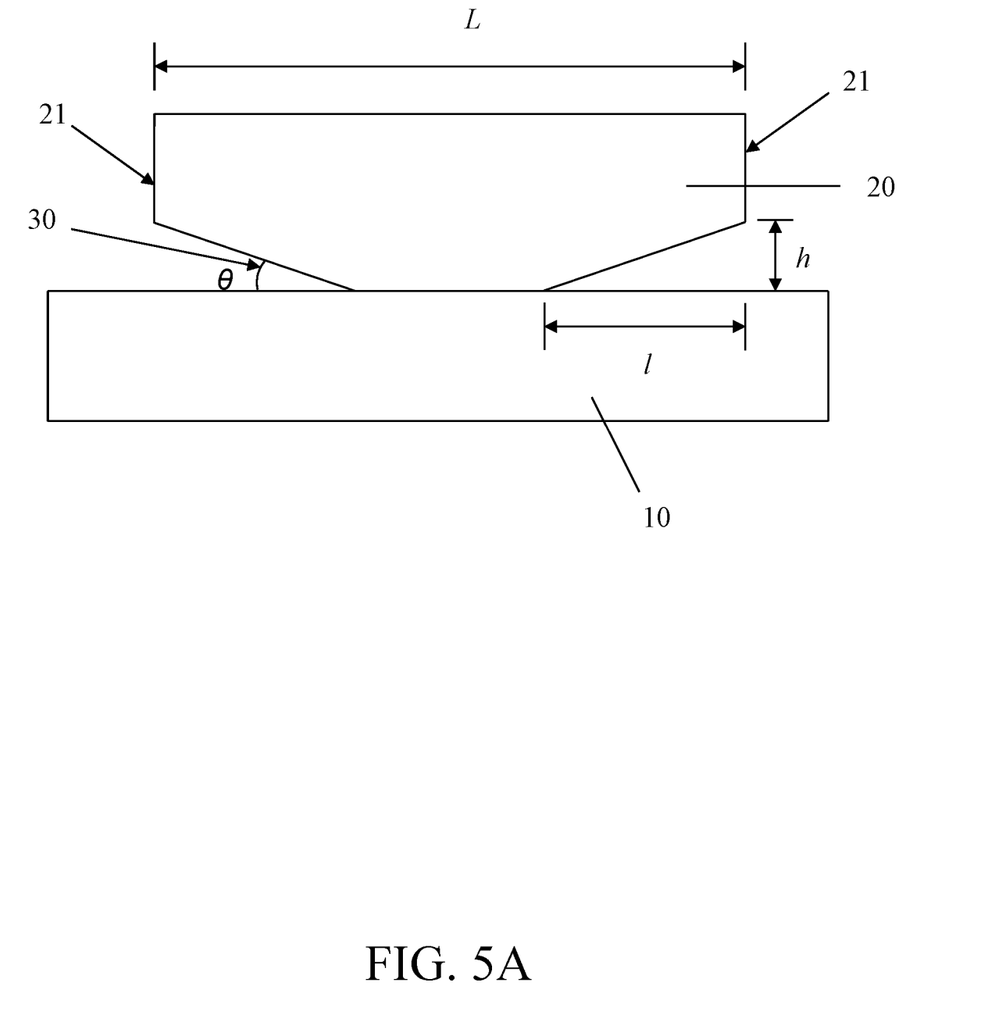
FIG. 5A is a plane structure diagram of an interconnect structure for insertion loss reduction in signal transmission, according to a fifth simulation experiment of the present invention.

In the fifth simulation experiment, the interconnect structure includes a substrate 10, an interconnect 20, an etch angle θ and an etch length l. The interconnect 20 is formed on the substrate 10 by the chemical etching process. In the fifth simulation experiment, undercut areas 30 are formed on left and right sides 21 of the bottom of the interconnect 20 at the contact of the interconnect 20 and the substrate 10 because of etching solution residue, and an etch angle θ is formed in the undercut area 30 between the interconnect 20 and the substrate 10.

Figure 5B:
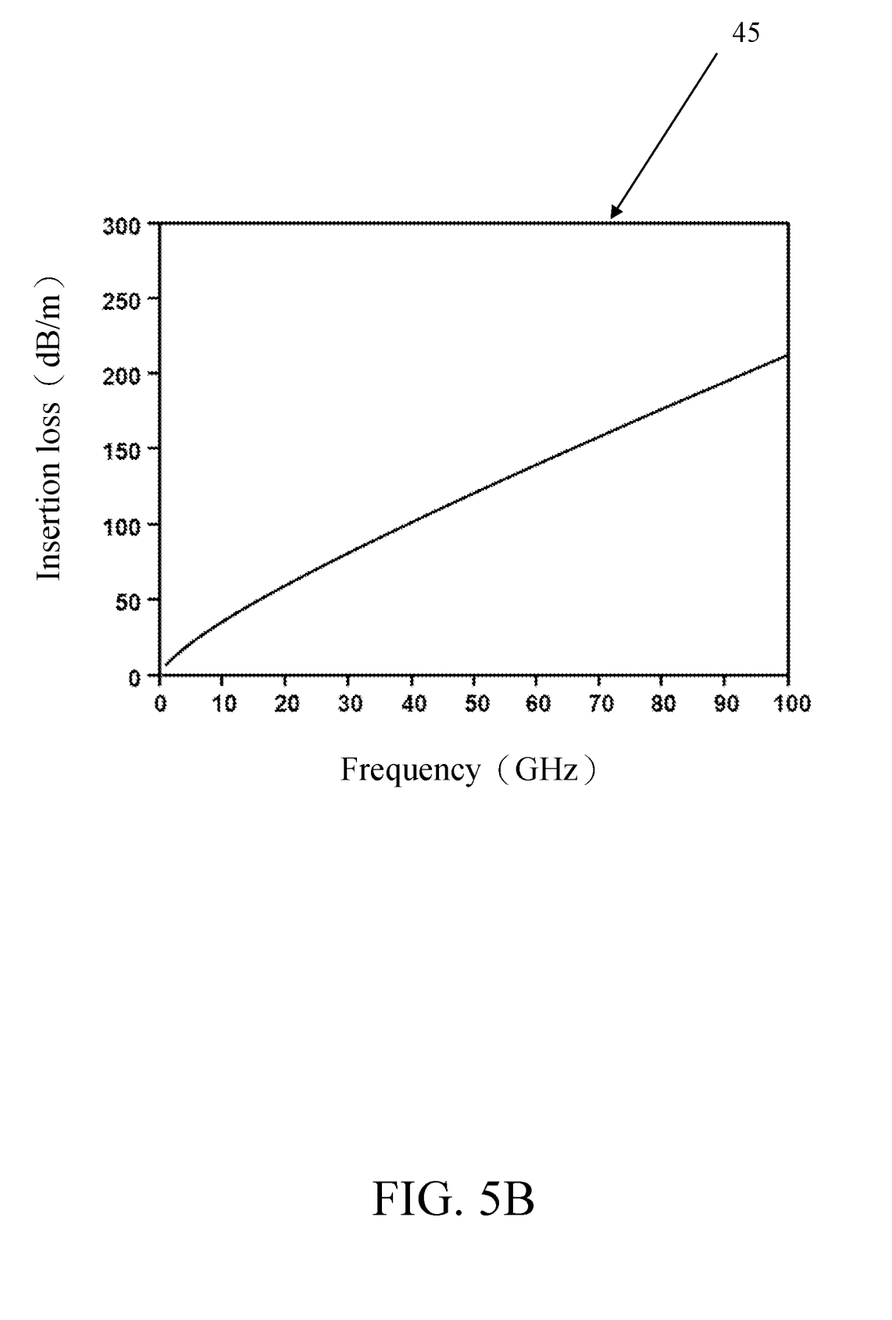
FIG. 5B is a fifth simulation experiment data diagram of the interconnect structure for insertion loss reduction in signal transmission, according to the fifth simulation experiment of the present invention.

Please refer to FIG. 5B, which is a fifth simulation experiment data diagram of an interconnect structure for insertion loss reduction in signal transmission of the present invention.

In the fifth simulation experiment, the simulation of the fifth simulation experiment is performed by using ANSYS-HFSS 3D high frequency electromagnetic simulation analysis software, and the related data used in the fifth simulation experiment includes that: the material of the interconnect 20 is copper foil, the dielectric constant of the substrate 10 is 3.57, the interconnect has the root mean square deviation of surface roughness in a range of 0 μm to 5 μm, the etch angle θ is 15 degrees, the original length L of the contact of the interconnect 20 and the substrate 10 is fixed as 153 μm, the etch height h is fixed as 4 μm, the etch length l is 14.9 μm, and the simulation for the signal transmission of the interconnect 20 formed on the substrate 10 is performed with the signal transmission frequency is in a range of 1 GHz to 100 GHz. It should be noted that the etch height h and the etch length l are exaggerated for clarity in FIG. 5A.

The fifth simulation experiment data 45 is measured in a condition that the etch height h is fixed as 4 μm, and the etch angle θ is controlled to be 15 degrees and the etch length l is controlled to be 14.9 μm. The fifth simulation experiment data 45 is shown in FIG. 5B, which is an insertion loss versus frequency diagram of the interconnect of the fifth simulation experiment. When the signal transmission frequency is 6 GHz, the insertion loss of the interconnect 20 in signal transmission is 23.95 dB/m; when the signal transmission frequency is 25 GHz, the insertion loss of the interconnect 20 in signal transmission is 70.27 dB/m; when the signal transmission frequency is 50 GHz, the insertion loss of the interconnect 20 in signal transmission is 120.61 dB/m; when the signal transmission frequency is 75 GHz, the insertion loss of the interconnect 20 in signal transmission is 167.45 dB/m; when the signal transmission frequency is 100 GHz, the insertion loss of the interconnect 20 in signal transmission is 212.41 dB/m.

According to analysis based on the first simulation experiment data to the fifth simulation experiment data, when the undercut area is not formed at the two sides 21 of the bottom of the interconnect 20 at the contact of the interconnect 20 and the substrate 10 because of etching solution residue, the insertion loss of the interconnect 20 is the highest among the first simulation experiment data to the fifth simulation experiment data; when the etch height is fixed, and the etch angle θ and the etch length l are formed at the left and right sides 21 of the bottom of the interconnect 20 at the contact of the interconnect 20 and substrate 10 because of the etching solution residue, the insertion loss of the interconnect 20 in signal transmission is lower than that of the interconnect 20 not having the undercut area at the left and right sides 21 of the bottom thereof at the contact of the interconnect 20 and the substrate 10. Therefore, it can know that the etch angle θ and the etch length l formed on the left and right sides 21 of the bottom of the interconnect 20 at the contact of the interconnect 20 and the substrate 10 because of the etching solution residue are helpful for insertion loss reduction of the interconnect 20 in signal transmission. In other words, in a condition that the etch height is fixed, the shorter contact length between the interconnect 20 and the substrate 10 and the mutual is more helpful for the insertion loss reduction of the interconnect 20 in signal transmission. Therefore, it can be known that the insertion loss of the interconnect can be reduced by controlling the etch angle θ and the etch length l when the etch height is fixed.

According to the above-mentioned contents, the present invention discloses that controlling the etching status is able to control the contact length between the interconnect 20 and the substrate 10 and decreasing the contact length between the interconnect 20 and the substrate 10 is able to reduce the effect of the substrate 10 on the high frequency/high-speed signal transmission, so as to decrease the insertion loss of the interconnect structure in signal transmission, thereby greatly improving the high-frequency/high-speed signal transmission effect.

Figure 6:
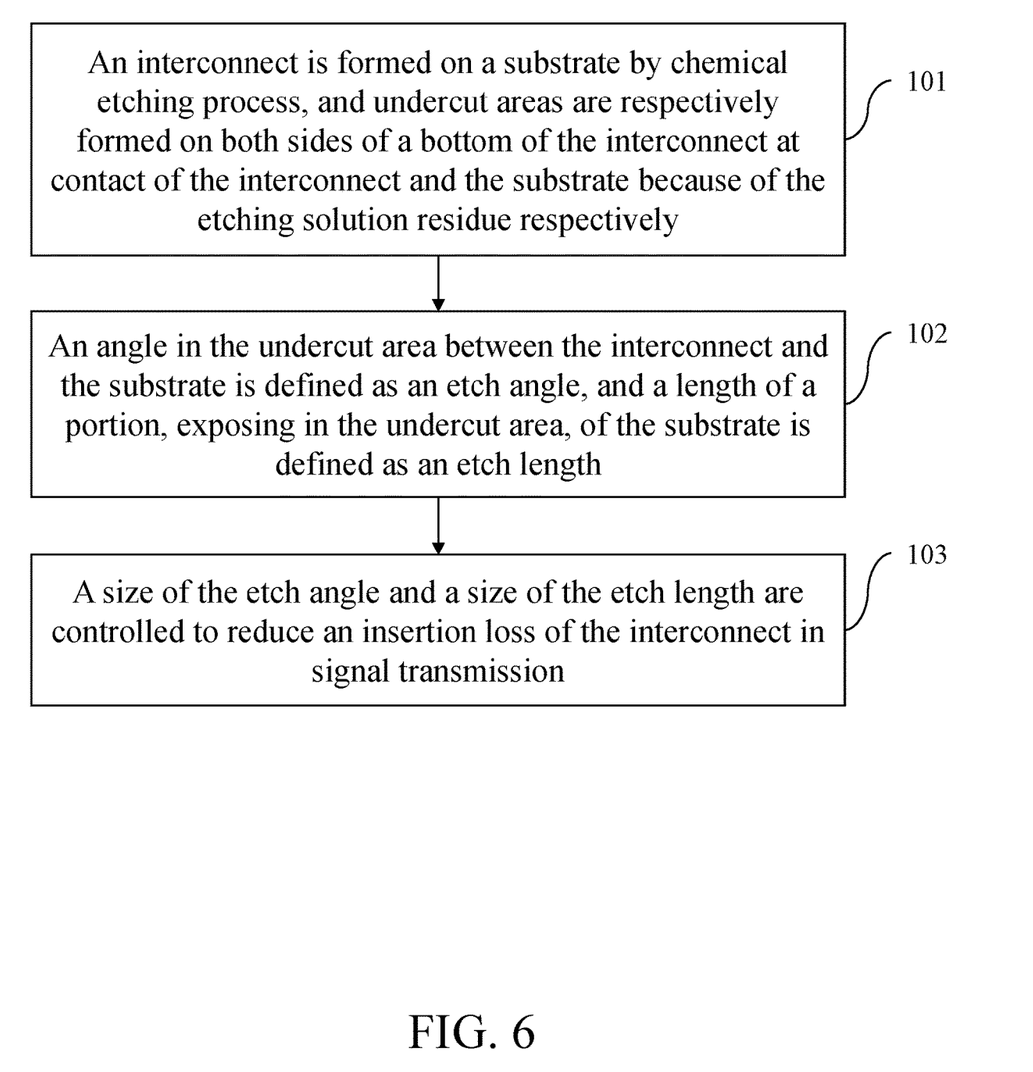
FIG. 6 is a flowchart of a method of forming an interconnect structure for insertion loss reduction in signal transmission.

Please refer to FIG. 6, which is a flowchart of a method of forming interconnect structure for insertion loss reduction in signal transmission, according to the present invention.

First of all, in a step 101, an interconnect is formed on a substrate by chemical etching process, and undercut areas are respectively formed on both sides of a bottom of the interconnect at contact of the interconnect and the substrate because of the etching solution residue. In a step 102, an angle in the undercut area between the interconnect and the substrate is defined as an etch angle, and a length of a portion, exposing in the undercut area, of the substrate is defined as an etch length. In a step 103, a size of the etch angle and a size of the etch length are controlled to reduce an insertion loss of the interconnect in signal transmission.

According to the above-mentioned contents, the difference between the present invention and the conventional technology is that the interconnect is formed on the substrate by chemical etching process, and when the interconnect is protected by photoresist in the chemical etching process, the etching direction of etching solution is not oriented, so the concave portions, which are defined as undercut areas, can be respectively formed on both sides of the bottom of the interconnect at contact of the interconnect and the substrate because of etching solution residue after the etching process; the included angle formed in the undercut area between the interconnect and the substrate is defined as the etch angle, and the length of the portion, exposing in the undercut area, of the substrate is defined as the etch length, and the size of the etch angle and the size of the etch length can be controlled to reduce the insertion loss of the interconnect in signal transmission; that is, controlling etching status can control the contact length between the interconnect and the substrate, and decreasing the contact length between the interconnect and the substrate can reduce the insertion loss of the interconnect structure in signal transmission, so as to greatly improve the high-frequency/high-speed signal transmission effect.

Therefore, the above-mentioned technical solution of the present invention can solve the conventional technology problem that the insertion loss of the interconnect varies in signal transmission, so as to achieve the technical effect of controlling the etch angle and the etch length to reduce the insertion loss of the interconnect.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A high-speed electroplating method, comprising:
    a substrate; and
    an interconnect formed on the substrate by chemical etching process, wherein undercut areas are formed on both sides of a bottom of the interconnect at contact of the interconnect and the substrate because of etching solution residue, respectively, and each of the undercut areas comprises:
    an etch angle formed in the undercut area between the interconnect and the substrate; and
    an etch length being a length of a portion, exposing in the undercut area, of the substrate;
    wherein a size of the etch angle is controlled and a size of the etch length is controlled when an etch height is controlled as fixed value to reduce an insertion loss as expected value in interconnect in signal transmission at a specific frequency.

2. The interconnect structure for insertion loss reduction in signal transmission according to claim 1, wherein a material of the interconnect comprises gold (Au), silver (Ag), copper (Cu), iron (Fe), cobalt (Co), nickel (Ni), palladium (Pd), platinum (Pt), titanium (Ti), tantalum (Ta), tin (Sn) and lead (Pb), or a combination thereof.

3. The interconnect structure for insertion loss reduction in signal transmission according to claim 1, wherein the interconnect has a root mean square of surface roughness (Rq) in a range of 0 μm to 5 μm, and the substrate has a dielectric constant in a range of 1 to 50.

4. The interconnect structure for insertion loss reduction in signal transmission according to claim 1, wherein the signal transmission is performed with a frequency in a range of 1 GHz to 300 GHz, and the etch angle is in a range of 5 degrees to 90 degrees.

5. The interconnect structure for insertion loss reduction in signal transmission according to claim 1, wherein the substrate comprises at least one of a glass substrate, a quartz substrate, a semiconductor substrate, a plastic substrate, a printed circuit board, and a high-speed low-loss substrate.

6. A method of forming interconnect structure for insertion loss reduction in signal transmission, and the method comprising:
    forming an interconnect on a substrate by chemical etching process, wherein undercut areas are respectively formed on both sides of a bottom of the interconnect at contact of the interconnect and the substrate because of the etching solution residue;
    defining an angle in the undercut area between the interconnect and the substrate as an etch angle, and defining a length of a portion, exposing in the undercut area, of the substrate as an etch length; and
    controlling a size of the etch angle and a size of the etch length when an etch height is controlled as fixed value to reduce an insertion loss as expected value in interconnect in signal transmission at a specific frequency.

7. The method of forming interconnect structure for insertion loss reduction in signal transmission according to claim 6, wherein when the etch height is controlled to be 4 μm, the etch angle is controlled to be 60 degrees, and the etch length is controlled to be 2.3 μm, the insertion loss of the interconnect is reduced to 196.47 dB/m in the signal transmission at 75 GHz, and the insertion loss of the interconnect is reduced to 248.44 dB/m in the signal transmission at 100 GHz.

8. The method of forming interconnect structure for insertion loss reduction in signal transmission according to claim 6, wherein when the etch height is controlled to be 4 μm, the etch angle is controlled to be 45 degrees, and the etch length is controlled to be 4 μm, the insertion loss of the interconnect is reduced to 190.23 dB/m in the signal transmission at 75 GHz, and the insertion loss of the interconnect is reduced to 240.80 dB/m in the signal transmission at 100 GHz.

9. The method of forming interconnect structure for insertion loss reduction in signal transmission according to claim 6, wherein when the etch height is controlled to be 4 μm, etch angle is controlled to be 30 degrees, and the etch length is controlled to be 6.9 μm, the insertion loss of the interconnect is reduced to 181.74 dB/m in the signal transmission at 75 GHz, the insertion loss of the interconnect is reduced to 230.42 dB/m in the signal transmission at 100 GHz.

10. The method of forming interconnect structure for insertion loss reduction in signal transmission according to claim 6, wherein when the etch height is controlled to be 4 μm, the etch angle is controlled to be 15 degrees, and the etch length is controlled to be 14.9 μm, the insertion loss of the interconnect is reduced to 167.45 dB/m in the signal transmission with at 75 GHz and the insertion loss of the interconnect is reduced to 212.41 dB/m in the signal transmission at 100 GHz.

* * * * *